United States Patent
Lin et al.

(10) Patent No.: US 10,079,177 B1
(45) Date of Patent: Sep. 18, 2018

(54) METHOD FOR FORMING COPPER MATERIAL OVER SUBSTRATE

(71) Applicant: United Microelectronics Corp., Hsinchu (TW)

(72) Inventors: Ko-Wei Lin, Taichung (TW); Ying-Lien Chen, Chiayi (TW); Chun-Ling Lin, Tainan (TW); Huei-Ru Tsai, Kaohsiung (TW); Hung-Miao Lin, Yunlin County (TW); Sheng-Yi Su, Kaohsiung (TW); Tzu-Hao Liu, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/694,354

(22) Filed: Sep. 1, 2017

(51) Int. Cl.
*H01L 21/44* (2006.01)
*H01L 21/768* (2006.01)
*H01L 21/288* (2006.01)

(52) U.S. Cl.
CPC ...... *H01L 21/76873* (2013.01); *H01L 21/288* (2013.01); *H01L 21/76846* (2013.01); *H01L 21/76847* (2013.01)

(58) Field of Classification Search
CPC ........... H01L 21/76856; H01L 21/7685; H01L 21/76873
See application file for complete search history.

(56) References Cited

U.S. PATENT DOCUMENTS

| | | | |
|---|---|---|---|
| 6,645,847 B2 | 11/2003 | Paranjpe et al. | |
| 9,051,641 B2 | 6/2015 | Lu et al. | |
| 9,425,092 B2 | 8/2016 | Emesh et al. | |
| 2001/0003063 A1* | 6/2001 | Hu | H01L 21/76843 438/683 |
| 2002/0019127 A1* | 2/2002 | Givens | H01L 21/28518 438/637 |
| 2003/0109133 A1* | 6/2003 | Girardie | H01L 27/08 438/638 |

\* cited by examiner

*Primary Examiner* — Jaehwan Oh
*Assistant Examiner* — John M Parker
(74) *Attorney, Agent, or Firm* — J.C. Patents

(57) ABSTRACT

A method is provided for forming copper material over a substrate. The method includes forming a barrier layer over a substrate. Then, a depositing-soaking-treatment (DST) process is performed over the barrier layer. A copper layer is formed on the cobalt layer. The DST process includes depositing a cobalt layer on the barrier layer. Then, the cobalt layer is soaked with $H_2$ gas at a first pressure. The cobalt layer is treated with a $H_2$ plasma at a second pressure. The second pressure is lower than the first pressure.

18 Claims, 6 Drawing Sheets

METHOD FOR FORMING COPPER MATERIAL OVER SUBSTRATE

BACKGROUND

1. Field of the Invention

The present invention generally relates to semiconductor fabrication, and particularly to a method for forming copper material over a substrate.

2. Description of Related Art

As usually known, the integrated circuit device is fabricated by semiconductor fabrication technology, in which various devices such as transistors with the interconnection structure are included to form the integrated circuit. A more powerful integrated circuit would involve more devices being integrated together. However, as the fact that the available area provided by the wafer for fabricating the device is limited, the devices are fabricated by sacking up along the vertical direction, so at adapt more devices within the limited circuit area.

When the device is stacked along the vertical direction to the wafer, the device is configured into multiple levels. In this situation, an interconnecting via is usually involved to connect the related devices in different device levels. The devices with the necessary connection according the circuit are accordingly interconnected by the interconnection structure, including the via extending at the vertical direction and a metal line extending at the horizontal plane at the corresponding device level. To form the interconnection via, the copper material is one of the suitable material to form the via, in which the copper via can be formed by plating process. The plating process usually needs a seed layer. As understood, the quality of the seed layer would also determine the quality of the via. Particularly, when the via gets deeper or the aspect ratio is large, the bottom part of the via may have poor condition for the seed layer, and then the contact performance of the via is reduced after the via is accomplished.

How to improve the quality of the interconnect via/trench is an issue in fabrication as concerned, in which the seed layer may contribute a further quality factor as concerned.

SUMMARY OF THE INVENTION

The invention provides a method for forming copper material over a substrate. The copper layer is to be used as the seed layer for the subsequent plating process. The seeding quality of the copper layer can be improved. As an example, the quality at bottom portion of a via can be significantly improved.

In an embodiment, the invention provides a method for forming copper material over a substrate. The method includes forming a barrier layer over a substrate. Then, a depositing-soaking-treatment (DST) process is performed over the barrier layer. A copper layer is formed on the cobalt layer. The DST process includes depositing a cobalt layer on the barrier layer. Then, the cobalt layer is soaked with $H_2$ gas at a first pressure. The cobalt layer is treated with a $H_2$ plasma at a second pressure. The second pressure is lower than the first pressure.

In an embodiment, as to the method for foil ling copper material over a substrate, the first pressure is in a range of 10 mtorr to 30 mtorr.

In an embodiment, as to the method for forming copper material over a substrate, the first pressure is adjusted by controlling a first gas flow.

In an embodiment, as to the method for forming copper material over a substrate, the first pressure is in a range of 10 mtorr to 20 mtorr.

In an embodiment, as to the method for forming copper material over a substrate, an operation temperature is in a range of 100° C. to 300° C.

In an embodiment, as to the method for forming copper material over a substrate, the substrate comprises a conductive layer on a base, a dielectric layer over the base, and an opening in the dielectric layer for exposing the conductive layer. The barrier layer at least covers over the opening.

In an embodiment, as to the method for forming copper material over a substrate, the conductive layer is a metal layer.

In an embodiment, as to the method for forming copper material over a substrate, the dielectric layer is a single layer or stacked layers.

In an embodiment, as to the method for forming copper material over a substrate, the opening is a via or a trench.

In an embodiment, as to the method for forming copper material over a substrate, a sidewall of the opening is smooth structure or a step-like structure.

In an embodiment, as to the method for forming copper material over a substrate, the DST process is performed once, twice, or more.

In an embodiment, as to the method for forming copper material over a substrate, the barrier layer reduces a diffusion of copper into a dielectric portion of the substrate.

In an embodiment, as to the method for forming copper material over a substrate, the barrier layer comprises Ta or TaN.

In an embodiment, as to the method for foil ling copper material over a substrate, the step of soaking the cobalt layer is to cause $H_2$ to react with the Co atoms of the cobalt layer.

In an embodiment, as to the method for forming copper material over a substrate, the $H_2$ gas at the first pressure causes an amount of $H_2$ on the cobalt layer at the bottom of the opening.

In an embodiment, as to the method for forming copper material over a substrate, it further comprises performing a copper plating process using the metal layer as a seed layer to plate copper.

In an embodiment, as to the method for forming copper material over a substrate, the metal layer is a copper seed layer.

In an embodiment, as to the method for forming copper material over a substrate, wherein the cobalt layer is formed by a Co precursor deposition.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention provides a method for forming copper material over a substrate. The invention is directed to forming a copper seed layer over a barrier layer with Co layer therebetween. The Co layer is used to improve the performance of the copper seed layer. The copper seed layer would be involved in the subsequent plating process. The seeding quality of the copper layer can be improved in the invention. As an example, the quality at least at the bottom portion of a via/trench can be significantly improved.

The invention has looked into the plating procedure in detail and proposed a depositing-soaking-treatment (DST) process involved in the plating process, such as copper plating.

Several embodiments are provided for descriptions but the invention is not just limited to the embodiments. Also and, several embodiments may also be combined into another embodiment.

Figure 1A:
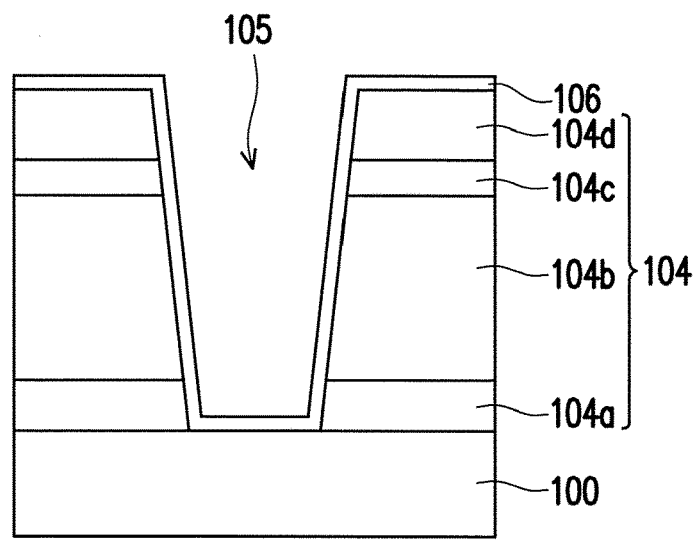
FIG. 1A-FIG. 1E are a drawing of cross-section structures, schematically illustrating the method for plating copper in a via, according to an embodiment of the invention.
Figure 1B:
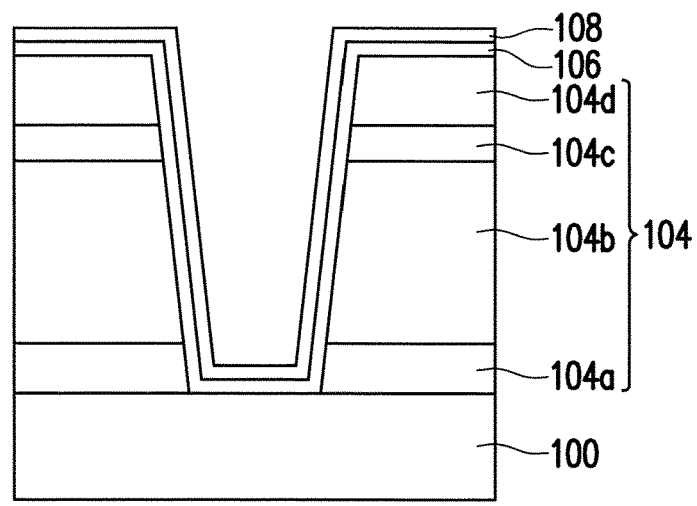
Figure 1C:
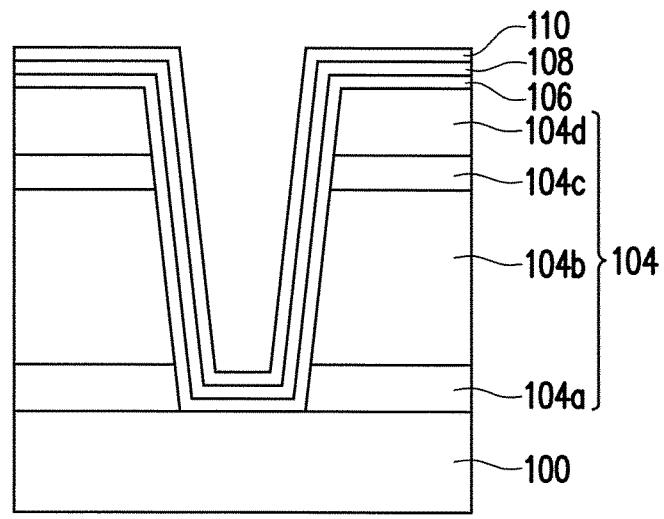
Figure 1D:
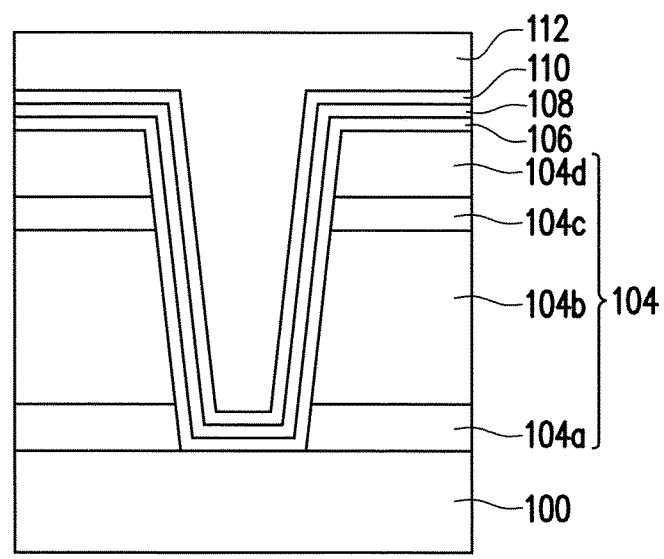
Figure 1E:
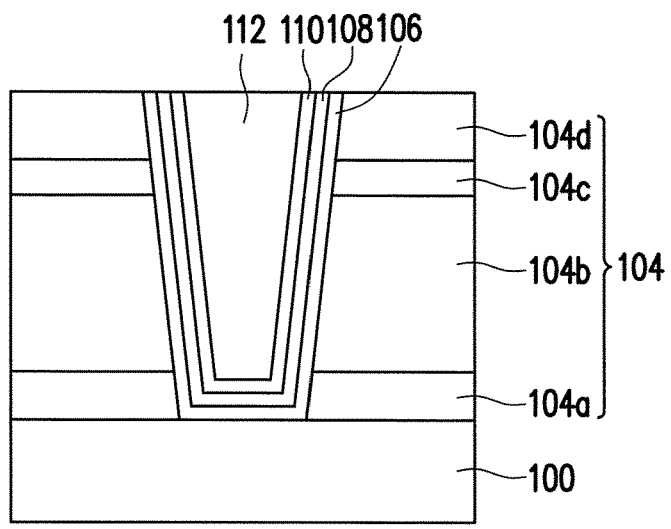

To the plating process, taking the copper plating process as an example, FIG. 1 to FIG. 1E are a drawing of cross-section structures, schematically illustrating the method for plating copper in a via, according to an embodiment of the invention.

Referring to FIG. 1A, as to a structure a substrate having a conductive layer 100 thereon, the dielectric layer 104 are formed over the substrate. The conductive layer 100 can be metal layer or copper layer, but not limited to. Here, the dielectric layer 104 is usually formed from multiple layers as stacked, each of the multiple layers usually is used in other fabrication process and is also formed here over the conductive layer 100, where an electric connection is subsequently needed. For example, the dielectric layer 104 in an example can include an etching stop layer 104a, an intermetal dielectric layer 104b, a first hard mask layer 104c, and a second had mask layer 104d, which are used for other fabrication processes and are stacked here over the conductive layer 100.

To electrically connect to the conductive layer 100 to other circuit level, a metal via such as copper via as an example, would be formed to contact the conductive layer 100. To form the via, the dielectric layer 104 is patterned to have an opening 105 to expose the conductive layer 100 at the specific location. Further, usually, a barrier layer 106 is formed over the dielectric layer 104 to cover the surface of the opening 105. The barrier layer 106 is used to reduce the metal diffusion into the dielectric layer 104 when the metal such as copper is formed in the opening 105 later.

Referring to FIG. 1B, the via is usually to be formed by plating process in subsequent process, in which a metal layer such as copper layer is usually formed on the barrier layer 106 to serve as the seed layer. However, the quality of the seed layer can be improved by forming a cobalt layer 108 before forming the seed layer. Referring to FIG. 1C, after the cobalt layer 108 is formed, a metal layer 110 such as copper layer is formed on the cobalt layer 108. The metal layer 110 serves as the seed layer for subsequent copper plating.

In order to have better performance of copper plating, a cobalt layer 108 is formed before forming the metal layer 110, so to improve the quality of the metal layer 110, serving as a seed layer. The cobalt layer 108 is usually subjected to a treatment to cut the additional molecules bonds with the Co atoms, so to get Co in the cobalt layer 108 in better Co purity.

Referring to FIG. 1D, a plating process is performed to form a plated metal layer 112, such as copper plated layer, is formed over the metal layer 110. The opening 105 in FIG. 1A has been fully filled.

Referring to FIG. 1E, the polishing process can be performed to remove the portion of the over the plated metal layer 112 other then the opening 105. As a result, the residual portion of the plated metal layer 112 forms the via.

In order to improve the quality of the cobalt layer 108, an $H_2$ plasma treatment at low pressure is usually performed to cut the materials other than Co material. The mechanism of the $H_2$ plasma treatment is described as follows.

Figure 2:
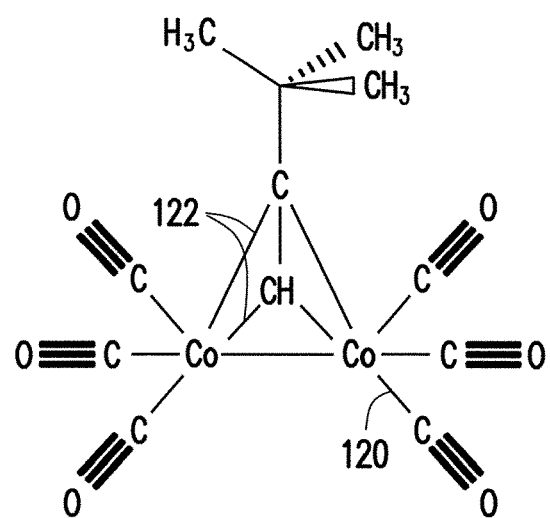
FIG. 2 is a drawing, schematically illustrating the treatment effect on the Co layer in molecular point of view, according to an embodiment of the invention.

FIG. 2 is a drawing, schematically illustrating the treatment effect on the Co layer in molecular point of view, according to an embodiment of the invention. Referring to FIG. 2, during the Co depositing precursor, Co is usually bonded with C or CH as the Co—C bonds and Co—CH bonds. However, Co material in intended to be pure as much as possible. During the treatment, the thermal effect can break the bonds 120. However, the bonds 122 of Co—C and Co—CH usually need a $H_2$ plasma treatment to break the bonds 122, so to get pure Co as much as possible.

Figure 3A:
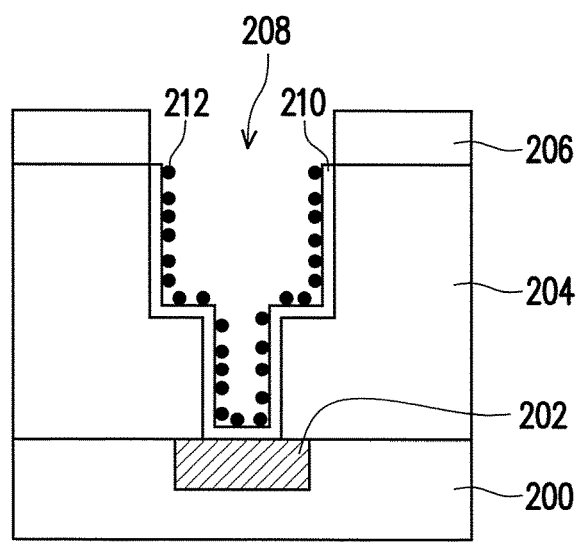
FIG. 3A-FIG. 3C are a drawing of cross-section structures, schematically illustrating the cycle of the depositing-soaking-treatment (DST) process, according to an embodiment of the invention.
Figure 3B:
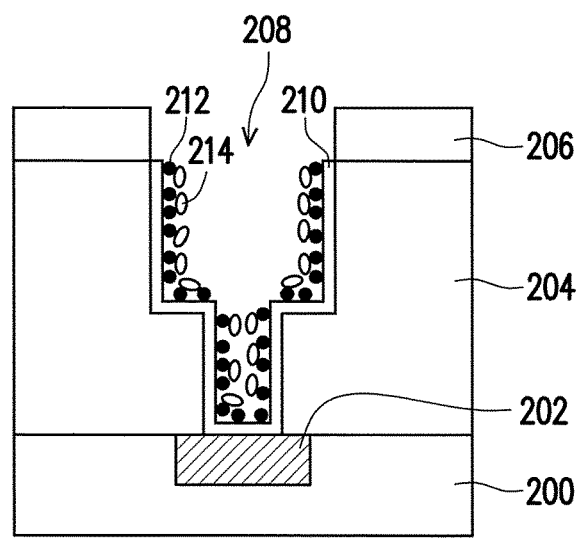
Figure 3C:
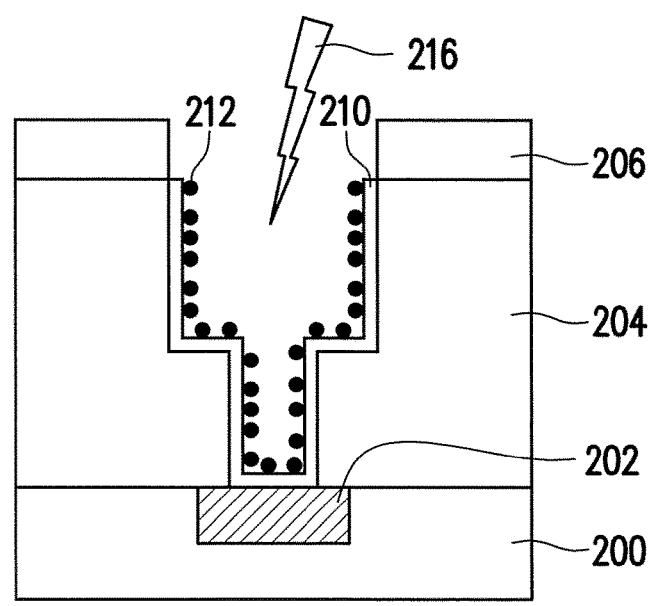

The invention has provided a method for forming copper material over a substrate, in which the quality of the cobalt layer 108 can be improved. FIG. 3A-FIG. 3C are a drawing of cross-section structures, schematically illustrating the cycle of the depositing-soaking-treatment (DST) process, according to an embodiment of the invention.

In an embodiment, referring to FIG. 3A, the substrate 200 as a base has a metal layer 202. The dielectric layer 204 is formed over the substrate 200. Using another mask layer 206, the dielectric layer 204 is patterned to have an opening 208 to expose the metal layer 202. Here, the opening 208 takes the dual-step structure as the example, in which the sidewall is not a smooth sidewall, such as a step-like structure. The opening 208 may have large aspect ratio but not limiting to. A barrier layer 210 is then formed on the peripheral surface of the opening 208, similar to the barrier layer 106 in FIG. 1A.

After then, a cobalt layer 212 is deposited by a Co precursor over the substrate 200 to cover on the barrier layer 210 at the peripheral surface of the opening 208. Here, the barrier layer 210 such as the barrier layer 106 in FIG. 1A can be formed to avoid the metal diffusion into the dielectric layer 204. The dielectric layer 204 can also be the staked structure as described for the dielectric layer 104. The detail can be referred to previous embodiments.

Referring to FIG. 3B, a soaking process is performed to adhere $H_2$ gas 214 onto the surface of the cobalt layer 212. As noted here, the soaking process is performed at higher pressure, such as in a rage from 10 mtorr to 30 mtorr, or in arrange 10 mtorr to 20 mtorr. The operation temperature in an example is in a range from 100° C. to 300° C. The pressure can be controlled by control the gas flow in an example. The $H_2$ soaking process can add the $H_2$ gas 214 on the sidewall and the bottom of the opening 208. Particularly, when the aspect ratio of the opening 208 is high, or the depth of the opening 208 is large, the $H_2$ gas can still provide more $H_2$ onto this deep portion.

Referring to FIG. 3C, a treating process 216 of $H_2$ plasma is then performed, in which the pressure less than the pressure when soaking the cobalt layer 212 with $H_2$ gas 214. The operation temperature may remain the same in an example. The treating process 216 of $H_2$ plasma would produce the mechanism in FIG. 2, so to further purify the cobalt layer 212.

As to the process in FIG. 3B to FIG. 3C, it can be called a depositing-soaking-treatment (DST) cycle. Depending on the need, the DST cycle can be performed once, twice, or more. A signal significantly improvement of the quality of copper seed layer at the bottom of the opening 206 has already been observed when the DST cycle is performed once or twice, in an example. After the DST cycle by one time or multiple tunes, the copper seed layer, copper plating process and polishing process, and so on for the subsequent processes.

Figure 4:
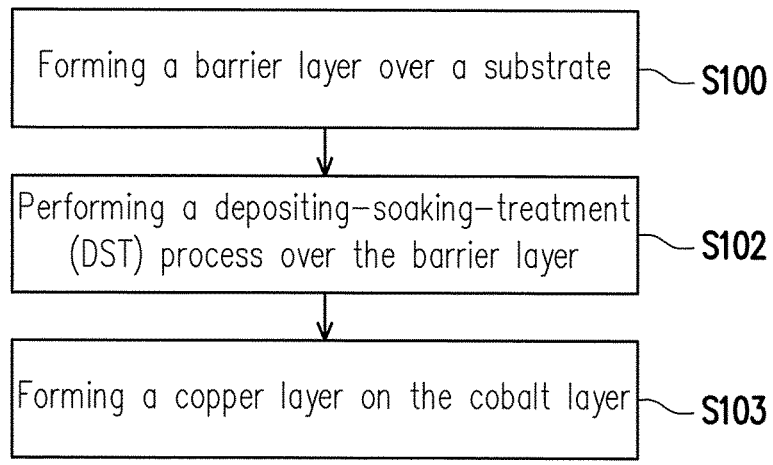
FIG. 4 is a drawing, schematically illustrating the process flow of the for forming copper material over a substrate, according to an embodiment of the invention.

As to the fabrication process in general, FIG. 4 is a drawing, schematically illustrating the process flow for forming copper material over a substrate, according to an embodiment of the invention.

Figure 5:
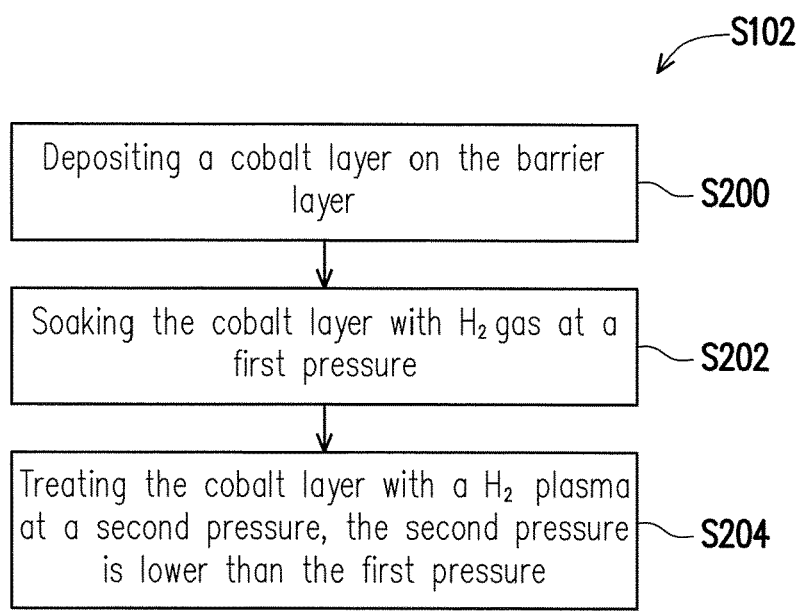
FIG. 5 is a drawing, schematically illustrating process flow of the DST process, according to an embodiment of the invention.

Referring to FIG. 4, in step S100, the method includes forming a barrier layer over a substrate. In step S102, a depositing-soaking-treatment (DST) process is performed over the barrier layer. In step S104, a copper layer is formed on the cobalt layer. As to the DST process S102, FIG. 5 is a drawing, schematically illustrating process flow of the DST process, according to an embodiment of the invention. Referring to FIG. 5, in step S200, the DST process includes depositing a cobalt layer on the barrier layer. In step S202, it is soaking the cobalt layer with $H_2$ gas at a first pressure. In step S204, it is treating the cobalt layer with a $H_2$ plasma at a second pressure, the second pressure is lower than the first pressure. The DST process include at least one DST cycle.

In a further embodiment, the first pressure is in a range of 10 mtorr to 30 mtorr.

In a further embodiment, the first pressure is adjusted by controlling a first gas flow.

In a further embodiment, the first pressure is in a range of 10 mtorr to 20 mtorr.

In a further embodiment, an operation temperature is in a range of 100° C. to 300° C.

In a further embodiment, the substrate comprises a conductive layer on a base, a dielectric layer over the base, and an opening in the dielectric layer for exposing the conductive layer. The barrier layer at least covers over the opening.

In a further embodiment, the conductive layer is a metal layer.

In a further embodiment, the dielectric layer is a single layer or stacked layers.

In a further embodiment, the opening is a via or a trench.

In a further embodiment, a sidewall of the opening is smooth structure or a step-like structure.

In a further embodiment, the DST process is performed once, twice, or more.

In a further embodiment, the barrier layer reduces a diffusion of copper into a dielectric portion of the substrate.

In a further embodiment, the barrier layer comprises Ta or TaN.

In a further embodiment, the step of soaking the cobalt layer is to cause $H_2$ to react with the Co atoms of the cobalt layer.

In a further embodiment, the $H_2$ gas at the first pressure causes an amount of $H_2$ on the cobalt layer at the bottom of the opening.

In a further embodiment, it further comprises performing a copper plating process using the metal layer as a seed layer to plate copper.

In a further embodiment, the metal layer is a copper seed layer.

In an embodiment, as to the method for forming copper material over a substrate. The cobalt layer is formed by a Co precursor deposition.

The invention has proposed the DST cycle involved in the plating process. The plating quality can be improved. The observation on the product as fabricated has shown the seed layer at least at the bottom of the opening can have better quality with reduction of voids. The quality of the seed layer is improved, and thereby the quality of the via can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming copper material over a substrate, comprising:
   forming a barrier layer over a substrate;
   performing a depositing-soaking-treatment (DST) process over the barrier layer; and
   forming a metal layer on the cobalt layer,
   wherein the DST process comprises:
   depositing a cobalt layer on the barrier layer;
   soaking the cobalt layer with $H_2$ gas at a first pressure; and
   treating the cobalt layer with a $H_2$ plasma at a second pressure, the second pressure is lower than the first pressure.

2. The method of claim 1, wherein the first pressure is in a range of 10 mtorr to 30 mtorr.

3. The method of claim 2, wherein the first pressure is adjusted by controlling a first gas flow.

4. The method of claim 2, the first pressure is in a range of 10 mtorr to 20 mtorr.

5. The method of claim 1, an operation temperature is in a range of 100° C. to 300° C.

6. The method of claim 1, wherein the substrate comprises a conductive layer on a base, a dielectric layer over the base, and an opening in the dielectric layer for exposing the conductive layer, wherein the barrier layer at least covers over the opening.

7. The method of claim 6, wherein the conductive layer is a metal layer.

8. The method of claim 6, wherein the dielectric layer is a single layer or stacked layers.

9. The method of claim 6, wherein the opening is a via or a trench.

10. The method of claim 6, wherein a sidewall of the opening is smooth structure or a step-like structure.

11. The method of claim 6, wherein the $H_2$ gas at the first pressure causes an amount of $H_2$ on the cobalt layer at a bottom of the opening.

12. The method of claim 1, wherein the DST process is performed once, twice, or more.

13. The method of claim 1, wherein the barrier layer reduces a diffusion of copper into a dielectric portion of the substrate.

14. The method of claim 1, wherein the barrier layer comprises Ta or TaN.

15. The method of claim 1, wherein the step of soaking the cobalt layer is to cause $H_2$ to react with the Co atoms of the cobalt layer.

16. The method of claim 1, further comprising performing a copper plating process using the metal layer as a seed layer to plate copper.

17. The method of claim 1, wherein the metal layer is a copper seed layer.

18. The method of claim 1, wherein the cobalt layer is formed by a Co precursor deposition.

\* \* \* \* \*